United States Patent
Ricotti et al.

(10) Patent No.: US 9,664,753 B2
(45) Date of Patent: May 30, 2017

(54) HALL-EFFECT-BASED MAGNETIC FIELD SENSOR HAVING AN IMPROVED OUTPUT BANDWIDTH

(71) Applicant: STMicroelectronics S.r.l., Agrate Brianza (IT)

(72) Inventors: Giulio Ricotti, Broni (IT); Marco Morelli, Bareggio (IT); Marco Marchesi, Borgonovo Val Tidone (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 42 days.

(21) Appl. No.: 14/637,698

(22) Filed: Mar. 4, 2015

(65) Prior Publication Data

US 2015/0276894 A1  Oct. 1, 2015

(30) Foreign Application Priority Data

Mar. 27, 2014 (IT) .............................. TO2014A0261

(51) Int. Cl.
G01R 33/06 (2006.01)
G01R 33/07 (2006.01)
G01R 33/00 (2006.01)

(52) U.S. Cl.
CPC ......... *G01R 33/07* (2013.01); *G01R 33/0017* (2013.01); *G01R 33/0029* (2013.01); *G01R 33/075* (2013.01)

(58) Field of Classification Search
CPC ............ G01R 33/0017; G01R 33/0035; G01R 33/0041; G01R 33/0206; G01R 33/06;
(Continued)

(56) References Cited

U.S. PATENT DOCUMENTS 3,613,021 A * 10/1971 Scheidt .................... H03F 1/36 330/1 R
3,906,641 A * 9/1975 Freeman .................. G05D 3/14 324/251
(Continued)

FOREIGN PATENT DOCUMENTS

SU       771582 A1    10/1980

OTHER PUBLICATIONS

Merriam Webster Dictionary, 2016.*
(Continued)

*Primary Examiner* — Patrick Assouad
*Assistant Examiner* — Demetrius Pretlow
(74) *Attorney, Agent, or Firm* — Gardere Wynne Sewell LLP

(57) ABSTRACT

A magnetic field sensor formed by a Hall cell having a first, second, third and fourth conduction nodes electrically coupled together by resistive paths. Flowing between the first and second conduction nodes is a control current. In the presence of a magnetic field, a difference of potential due to the Hall effect is generated between the third and fourth conduction nodes. An operational amplifier has an inverting input terminal coupled to the fourth conduction node, a non-inverting input terminal biased at the voltage at the third conduction node, and an output terminal coupled in feedback mode to the inverting input by a feedback resistor. The current generated in feedback through the feedback resistor generates a voltage indicating unbalancing, due to the Hall effect, between the third and fourth conductive nodes, and consequently indicates the intensity of the magnetic field that acts upon the Hall cell.

10 Claims, 4 Drawing Sheets

(58) Field of Classification Search
CPC .... G01R 33/07; G01R 33/072; G01R 33/075; G01R 33/077; G01R 33/09; G01R 33/091; G01R 33/093; G01R 33/095; G01R 33/096; G01R 33/098; G01D 5/142; G01D 5/145; G01D 5/147; G01D 5/16; G01B 7/30
USPC .......... 324/202, 225, 207.2, 207.11, 207.12, 324/207.13, 207.14, 207.21, 244, 251, 324/252, 260, 261, 262; 338/32 R, 32 H; 257/421, 425, E43.002, E43.003, 257/E43.004; 327/510, 511; 702/104
See application file for complete search history.

(56) References Cited

U.S. PATENT DOCUMENTS

| | | | |
|---|---|---|---|
| 4,646,014 A | | 2/1987 | Eulenberg |
| 4,804,892 A | | 2/1989 | Muller |
| 4,882,512 A | * | 11/1989 | Andrus .................. G01R 33/07 310/90.5 |
| 5,426,364 A | | 6/1995 | Yi |
| 5,818,225 A | * | 10/1998 | Miekley ................. G01D 3/036 324/225 |
| 9,110,121 B2 | * | 8/2015 | Motz ..................... G01R 33/075 |
| 2004/0129934 A1 | * | 7/2004 | Takatsuka ............. H01L 43/065 257/40 |
| 2010/0308886 A1 | * | 12/2010 | Ogawa ................. G01R 33/072 327/307 |
| 2013/0069641 A1 | | 3/2013 | Motz |

OTHER PUBLICATIONS

IT Search Report and Written Opinion for IT TO2014 A000261 dated Nov. 19, 2014 (14 pages).

Michel Demierre: "Improvements of CMOS Hall Microsystems and Application for Absolute Angular Position Measurements," Institute of Microelectronics and Microsystems, Sep. 2003 (205 pages).

\* cited by examiner

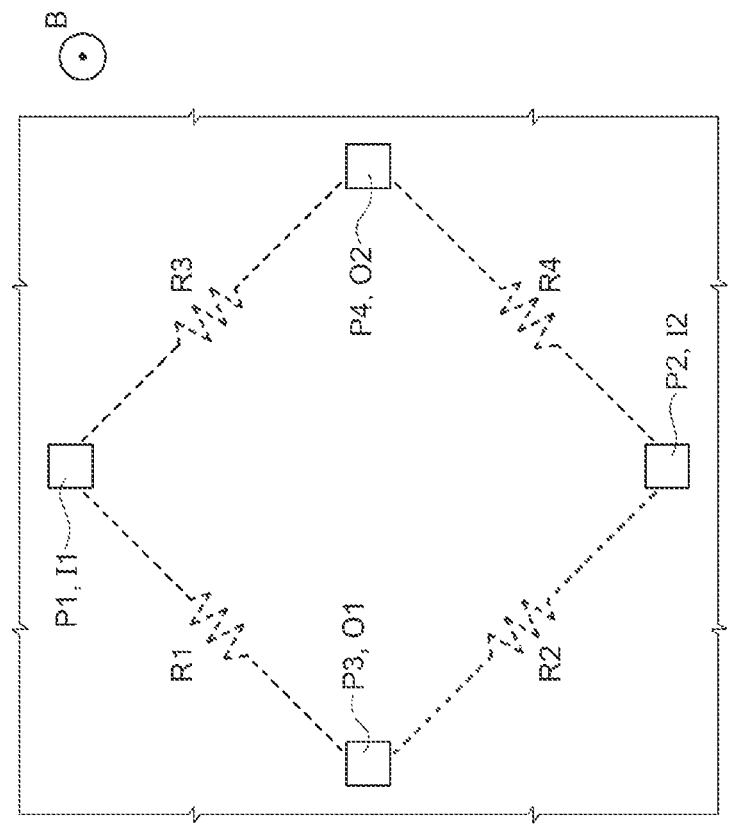
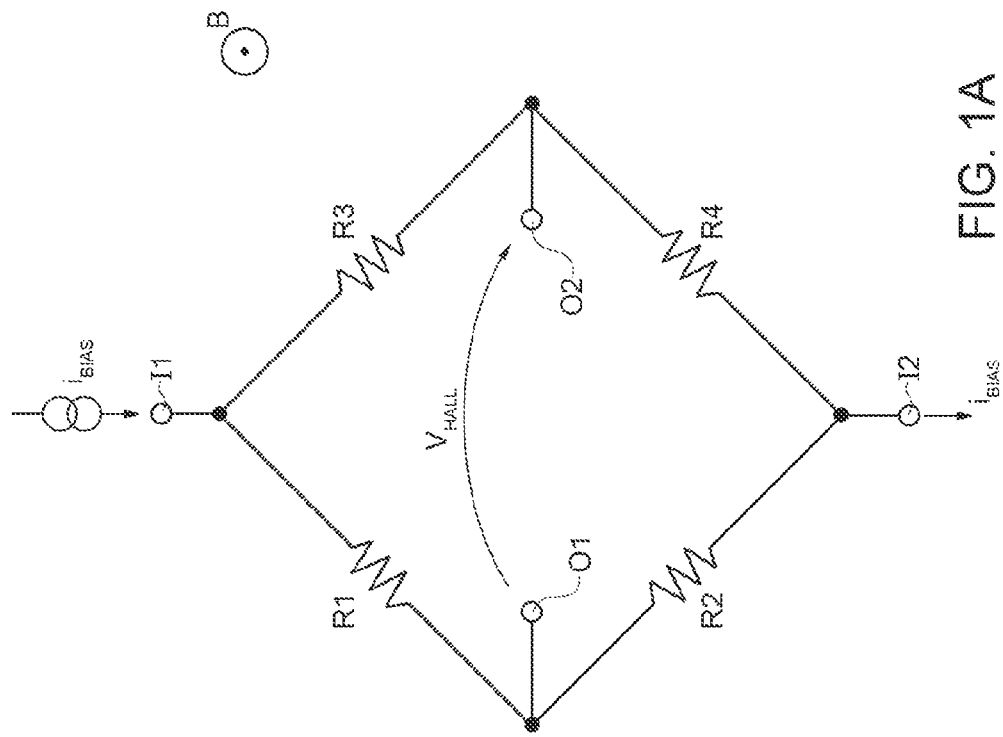
FIG. 1B
FIG. 1A

HALL-EFFECT-BASED MAGNETIC FIELD SENSOR HAVING AN IMPROVED OUTPUT BANDWIDTH

PRIORITY CLAIM

This application claims priority from Italian Application for Patent No. TO2014A000261 filed Mar. 27, 2014, the disclosure of which is incorporated by reference.

TECHNICAL FIELD

The present invention relates to a Hall-effect-based magnetic field sensor.

BACKGROUND

As is known, is frequently needed to measure magnetic fields accurately. For this purpose, various solutions have been proposed. In particular, there has already been proposed use of Hall sensors that exploit the well-known Hall effect, whereby, if a current flows through a conductor immersed in a magnetic field, the latter exerts a force transverse on the charge carriers that flow in the conductor and said force tends to "push" said charge carriers onto one side of the conductor. This effect is particularly evident in a thin flat conductor. The accumulation of the charges on the sides of the conductor determines a measurable voltage between the sides of the conductor itself and thus represents a measurement of the magnetic field.

A Hall sensor may be represented schematically as a resistive Wheatstone bridge, as illustrated in FIG. 1A, and is fabricated by forming resistive wells, for example implanted in a semiconductor or insulating substrate, accessible from outside by conductive pads P1-P4, as illustrated schematically, in top plan view, in FIG. 1B. The die of FIG. 1B provides a diffused resistive matrix, in which the resistive wells associated to two inputs I1 and I2 are electrically coupled to the resistive wells associated to two outputs O1 and O2, for example according to the connection scheme of FIG. 1A. Between the inputs I1 and I2 there flows, in use, a biasing, or control, current $i_{BIAS}$. In the presence of a magnetic field B in which the resistive bridge of FIGS. 1A, 1B is immersed, the output voltage $V_{HALL}$, measured as electrical potential difference that is set up across the outputs O1 and O2, assumes a value different from (greater in modulus than) the value that may be measured in resting conditions, i.e., in the absence of magnetic field B. Said variation is a function of the value of the magnetic field B in which the Hall sensor is immersed (the voltage $V_{HALL}$ is proportional to the magnetic field B).

Reading of the voltage $V_{HALL}$ enables acquisition of information on the magnetic field B (field intensity and direction). However, there may exist different elements that tend to limit the frequency response of the Hall sensor. For instance, the parasitic capacitances associated to the output nodes O1 and O2, which vary as a function of the dimensions of the Hall sensor, may limit the operating bandwidth to a few tens of kilohertz, which is insufficient for some types of applications (for example, the driver circuits for control of electric motors).

There is accordingly a need to provide a magnetic field sensor exploiting the Hall effect that is such as to overcome the drawbacks of the known art.

SUMMARY

In an embodiment, a magnetic field sensor comprises a first Hall cell having a first conduction node, a second conduction node, a third conduction node and a fourth conduction node electrically coupled together by one or more resistive paths. The first and second conduction nodes are biasing inputs of the first Hall cell, which can be biased for generating a flow of control current through said one or more resistive paths. The third and fourth conduction nodes are outputs of the first Hall cell, wherein, in an operating condition of presence of a magnetic field acting upon the first Hall cell, a Hall voltage is generated between said third conduction node and said fourth conduction node. A first biasing circuit is operatively coupled between said first and third conduction nodes and configured to bias the third conduction node at a first operating voltage and to bias the first conduction node at a second operating voltage to generate said flow of control current. A second biasing circuit has a first input terminal operatively coupled to the fourth conduction node, a second input terminal adapted to receive a third operating voltage that is a function of the first operating voltage, and an output terminal coupled in a feedback mode to the first input by a detection module. The second biasing circuit is configured to generate, during said operating condition of presence of the magnetic field, a feedback current through the detection module such as to maintain the fourth conduction node at the voltage value defined by the third operating voltage. The detection module is configured to generate an output signal that is a function of said feedback current.

BRIEF DESCRIPTION OF THE DRAWINGS

For a better understanding of the present invention, preferred embodiments thereof are now described, purely by way of non-limiting example and with reference to the attached drawings, wherein:

FIGS. 1A and 1B are a schematic illustration of a Hall cell of a known type, according to a circuit representation based upon a resistive Wheatstone bridge and in top plan view of a die that integrates the Wheatstone bridge;

DETAILED DESCRIPTION OF THE DRAWINGS

Figure 2:
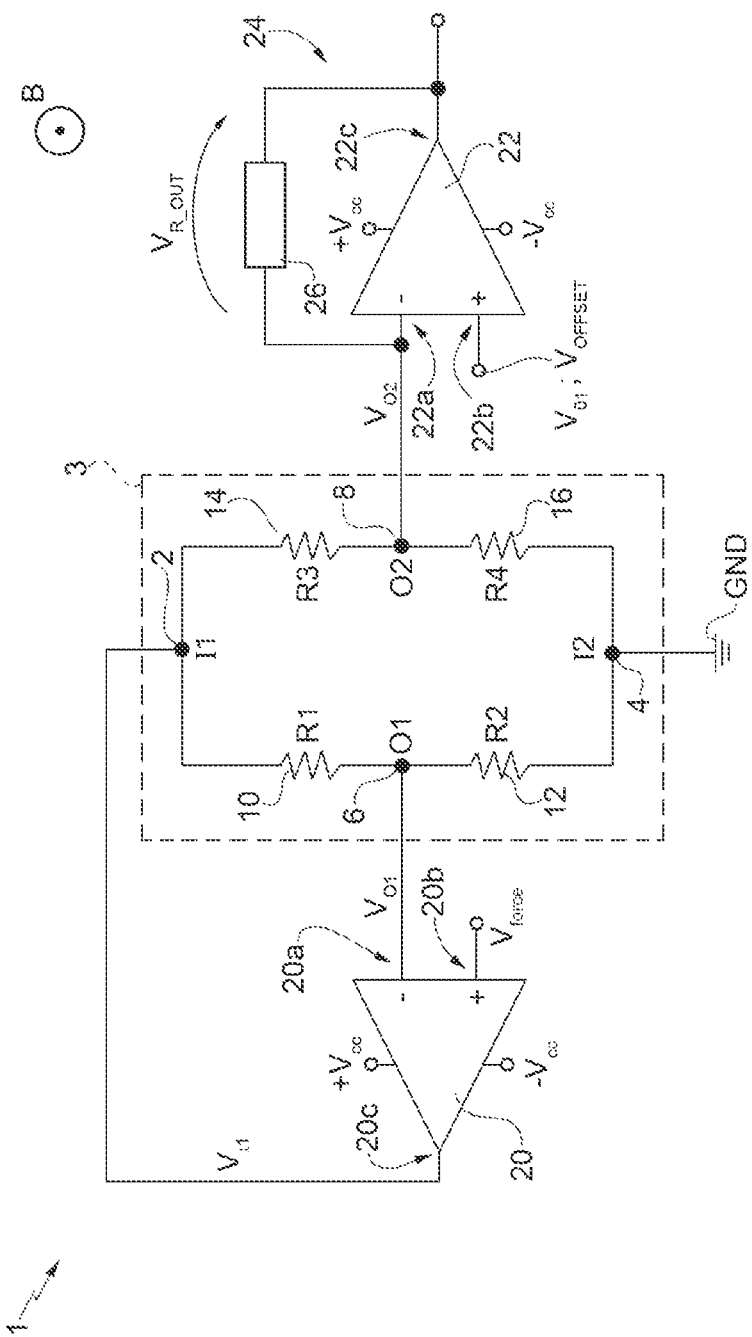
FIG. 2 shows, in circuit form, a magnetic field sensor according to one embodiment.

According to one aspect a magnetic field sensor is provided, comprising a Hall cell having a first conduction node I1, a second conduction node I2, a third conduction node O1, and a fourth conduction node O2 electrically coupled together by one or more resistive paths R1-R4. In particular, said resistive paths R1-R4 provide a Wheatstone bridge (see, for example, FIGS. 1A and 1B). The first and second conduction nodes are, respectively, a first biasing input I1 and a second biasing input I2 of the Hall cell, flowing between which is a biasing current $i_{BIAS}$, as is known. The third and fourth conduction nodes are, respectively, a first output O1 and a second output O2 of the Hall cell, across which a Hall voltage is set up in the presence of an external magnetic field B acting upon the Hall cell. According to one embodiment (for example, as shown in FIG. 2) further present is a first operational amplifier (designated by the reference 20) having its inverting input coupled to the first output O1 of the Hall cell, its non-inverting input biased at a first operating voltage, and an output terminal coupled to the first biasing input I1 of the Hall cell (and thus fed back onto the inverting input via the resistive path R1 of the Wheatstone bridge). The second biasing input I2 of the Hall cell provides a reference node, for example at ground voltage.

For operation of the first operational amplifier, the voltage set at the non-inverting input is (ideally) brought to the inverting input, which, in this case, corresponds to the first output O1 of the Hall cell. In this way, the first output O1 of the Hall cell is set at virtual ground, and the parasitic capacitance associated to said conduction node O1 is not charged/discharged significantly in use.

Once again with reference to the embodiment of FIG. 2, a second operational amplifier is further present (designated by the reference number 22), having an inverting input terminal coupled to the second output O2 of the Hall cell and a non-inverting input terminal biased at a voltage that is a function of (for example, equal to) the voltage present on the first output O1 of the Hall cell. The output terminal of the second operational amplifier is feedback-connected to the inverting input of the same second operational amplifier by a feedback resistor. The feedback current generated through the feedback resistor generates, across the latter, a voltage that is dependent upon the Hall-effect unbalancing between the first and second outputs O1 and O2 and consequently indicates the intensity of the magnetic field B that acts upon the Hall cell. As may well be understood, according to this embodiment of the present invention, both the first output O1 and the second output O2 of the Hall cell are at virtual ground, as a result of operation of the operational amplifiers 20 and 22. The current generated at output from the second operational amplifier consequently flows through the feedback resistance and is again injected into the Hall cell to compensate the unbalancing generated by the Hall voltage in the presence of magnetic field. It is consequently evident that the current that traverses the feedback resistor, which may be detected as voltage across the feedback resistor itself, indicates the Hall potential $V_{HALL}$ between the outputs O1 and O2 of the Hall cell. The potential $V_{HALL}$ in turn indicates the intensity of the magnetic field B to be measured. The relation that exists between the intensity of the magnetic field B to be measured and the value of voltage across the feedback resistor may, for example, be detected experimentally by tests in conditions of magnetic field of variable intensity. For a plurality of known values of intensity of the magnetic field that acts upon the Hall cell a respective voltage value across the feedback resistor is acquired, and an experimental relationship that links the output of the magnetic field sensor to the magnetic field to be measured is thus obtained.

It is evident that the first and second operational amplifiers may be replaced by circuit elements of another type, which are designed to perform the same functions, or similar functions, i.e., bias the outputs of the Hall cell to prevent fluctuations of the charge of the parasitic capacitance at said conduction nodes, generating the biasing current between the inputs of the Hall cell, and generating an output current, the value of which is a function of the Hall voltage resulting from an external magnetic field. Likewise, the feedback resistor may be obtained according to any technology, comprising electrical/electronic elements of a passive and/or active type.

Preventing, or significantly reducing, phenomena of charge and discharge of the parasitic capacitances associated to the outputs of the Hall cell has as positive effect increase of the operating bandwidth of the magnetic field sensor. Generation of an output signal (indicating the magnetic field) in the form of current signal presents considerable advantages and in particular enables mutual connection in parallel of a plurality of Hall cells and makes it possible to add together all the output-current signals from each of said Hall cells to obtain an amplified signal that is easier to read.

There now follows a more detailed description of a preferred embodiment of the magnetic field sensor. In particular, a magnetic field sensor 1, including a Hall cell 3 of the type shown in FIGS. 1A, 1B, is illustrated schematically in FIG. 2, according to one aspect. The Hall cell 3 includes: a first conduction terminal 2, here having the function of first input (I1); a second conduction terminal 4, here having the function of second input (I2), coupled to a reference voltage, for example a ground reference voltage GND; a third conduction terminal 6, here having the function of first output (O1); and a fourth conduction terminal 8, here having the function of second output (O2). For instance, as is shown in FIG. 1A, each of the terminals 2, 4, 6 and 8 forms a conductive node of a resistive Wheatstone bridge. According to this configuration, the first input I1 is electrically coupled to the first output O1 by a resistive path (referred to hereinafter more simply as "resistor") 10, having a value of resistance R1; the first output O1 is electrically coupled to the second input I2 by a respective resistive path (referred to hereinafter more simply as "resistor") 12, having a value of resistance R2; the first input I1 is electrically coupled to the second output O2 by a resistive path (referred to hereinafter more simply as "resistor") 14, having a value of resistance R3; and the second output O2 is electrically coupled to the second input I2 by a respective resistive path (referred to hereinafter more simply as "resistor") 16, having a value of resistance R4.

It is, however, evident that the inputs I1, I2 and outputs O1, O2 of the Hall cell 3 may be electrically coupled together according to any configuration, and in particular the electrical connection between the inputs I1 and I2 and the outputs O1 and O2 may be different from the one shown. For instance, there may be, in addition or as an alternative to the electrical couplings shown in FIG. 2, a further resistive connection between the first input I1 and the second input I2, and/or a further resistive connection between the outputs O1 and O2.

In general, in use, flowing between the input terminals I1, I2 is a biasing current $i_{BIAS}$. Generated between the output terminals O1, O2, in use and in the presence of a magnetic field B, is a potential difference due to the Hall effect. The input terminals and the output terminals are arranged to be aligned with respect to one another in respective substantially mutually orthogonal directions that define a plane that is parallel to the plane of lie of the Hall cell 3. A magnetic field sensor 1 having such a Hall cell 3 is sensitive to components of a magnetic field B that are orthogonal to the plane of lie of the Hall cell 3. See, for example, FIGS. 1A and 1B, which show a Hall cell of this type.

According to one aspect, the magnetic field sensor 1 further comprises a first operational amplifier 20, supplied in voltage between −Vcc and +Vcc (e.g., between −15V and +15V), having its inverting input 20a electrically coupled to the first output O1 and its non-inverting input 20b electrically biased to a predefined voltage value $V_{force}$, in particular equal to Vdd/2. The voltage Vdd is chosen according to the need, as compromise between the maximum voltage available in the application considered and the sensitivity that it is desired to obtain for the Hall sensor 1 (in fact, the voltage at output from the Hall sensor is proportional to the supply voltage). For instance, the voltage Vdd is chosen in the range 2-15 V, more in particular 3-5 V, for example 4 V. The output 20c of the operational amplifier 20 is electrically coupled to the first input I1, thus biasing it and generating the flow of the biasing current $i_{BIAS}$ between the nodes 2 and 4. Thus, as may be noted, the output 20c of the first operational amplifier 20 is electrically coupled to the first input 20a of the first operational amplifier 20 through the resistor 10.

The magnetic field sensor 1 further comprises a second operational amplifier 22, supplied in voltage between −Vcc and +Vcc (e.g., between −15V and +15V), having its inverting input 22a electrically coupled to the second output O2 and its non-inverting input 22b electrically biased at a predefined reference voltage $V_{ref}$, for example equal to the voltage $V_{O1}$ present on the first output O1. The output 22c of the operational amplifier 22 is fed back onto the inverting input 22a of the amplifier 22 itself through a feedback branch 24 that includes a feedback resistor 26. The feedback resistor is, for example, a passive resistive element. However, the feedback resistor may be obtained according to any technology, and may be formed by, or comprise, active elements (e.g., transistors) and/or passive elements. For instance, the electrical resistance of the feedback resistor 26 is comprised between 50 and 300 kΩ, in particular between 100 and 200 kΩ, for example approximately 150 kΩ.

As may be noted, the first operational amplifier 20, the resistor 10, and the resistor 12 provide, together, a non-inverting-amplifier configuration for the first operational amplifier 20. The input signal $V_{force}$, applied to the input 20b of the operational amplifier 20, and the divider formed by the resistors 10 and 12, provide a negative reaction. Since, ideally, the voltage applied to the input 20b is equal to the voltage applied to the input 20a of the operational amplifier 20, we have that the voltage $V_{O1}$ at the input 20a is equal to the voltage $V_{force}$ at the input 20b, and both are equal to Vdd/2. The signal $V_u$, generated at output from the first operational amplifier 20, is equal to $V_{f1}=V_{force} \cdot (R1+R2)/R2$.

Introducing a further idealization, and assuming that the resistors 10, 12, 14 and 16 all have the same a resistance (i.e., R1=R2=R3=R4), we have $V_{f1}$=Vdd. Consequently, also the voltage at the first input I1 of the Hall cell 3 is Vdd. It is evident that, following the idealizations so far made, on each resistor 8, 10, 12 and 16 we have a voltage drop equal to Vdd/2. It follows that the voltage $V_{O2}$ present to the output O2, set at input to the terminal 22a of the second operational amplifier 22, is also equal to Vdd/2.

In the absence of an external magnetic field B, it is desirable for the output of the magnetic field sensor 1 to be equal to a predefined value, for example to the voltage at input to the terminal 22b of the second operational amplifier 22, for instance equal to $V_{O1}$, which is the voltage value present on the output O1 of the Hall cell 3. Since, as has been said, $V_{O1}$ and $V_{O2}$ both have the value Vdd/2, in this condition current does not flow through the feedback resistor 26 and the output of the magnetic field sensor 1 is the output 22c of the second operational amplifier 22, equal to Vdd/2.

As is known, the presence of a magnetic field B orthogonal to the plane in which the Hall cell 3 lies causes a deviation of the electrical charges that flow between the first terminal 2 and the second terminal 4. This deviation entails onset of a preferred path for the charge carriers, which will thus flow between the first terminal 2 and the second terminal 4 preferably through the resistors 10 and 12, or else preferably through the resistors 14 and 16, according to the orientation of the magnetic field B. There follows an unbalancing between the values of voltage $V_{O1}$ and $V_{O2}$ on the third terminal 6 and the fourth terminal 8, respectively. Since the inverting terminal 22b of the second operational amplifier 22 is at the voltage $V_{O2}=V_{O1}$=Vdd/2, the second operational amplifier 22 operates for bringing the voltage on the inverting terminal 22a to the same value $V_{O2}=V_{O1}$=Vdd/2. This results in a current that flows between the output 22c of the second operational amplifier 22 and the inverting input 22a, through the feedback resistor 26, thus generating a non-zero voltage $V_{R\_OUT}$ across the feedback resistor 26. The value of the current that flows in the feedback branch 24 is such as to compensate the unbalancing between the voltages $V_{O1}$ and $V_{O2}$ generated following upon application of the magnetic field B. Consequently, the value of the voltage $V_{R\_OUT}$ read across the feedback resistor 26 indicates a value of the magnetic field B, which may thus be easily measured. Furthermore, the sign of the voltage $V_{R\_OUT}$ across the feedback resistor 26 indicates the orientation of the magnetic field B.

However, as is known, the resistors 10, 12, 14, and 16 are not ideal, and consequently they may show an effective value of the respective resistance R1-R4 that is not uniform. Furthermore, also the first and second operational amplifiers 20, 22 are not ideal and consequently, for each of them, the difference of potential between the inverting terminal 20a, 22a and the respective non-inverting terminal 20b, 22b is other than zero. These non-idealities cause a flow of current through the feedback resistor 26, even in conditions of absence of an external magnetic field B, that is such as to generate a non-zero feedback current through the feedback resistor 26 even in conditions of absence of magnetic field; this voltage is an "offset" of the magnetic field sensor 1. The offset is an important parameter that affects the performance of the Hall sensor 1, as is well known in the microelectronic field.

To overcome this drawback, it is advisable to set the voltage on the non-inverting terminal 22b of the second operational amplifier 22 at a value different from that of the voltage $V_{O1}$ present on the third terminal 6 of the Hall cell 3. In particular, it is expedient to choose a voltage value $V_{OFFSET}$, to be supplied to the non-inverting terminal 22b, such as to compensate the non-idealities of the resistors 10, 12, 14, 16 and of the operational amplifiers 20, 22. For instance, it is possible to choose the voltage value $V_{OFFSET}$ as the value for which, in the absence of magnetic field B that acts upon the Hall cell 3, no current flows through the feedback resistor 26, or else to set the voltage value $V_{OFFSET}$ for having on the output 22c of the second operational amplifier 22 a voltage value, with zero magnetic field B, that is pre-determined and desired (for example chosen according to the input dynamics of the possible circuit cascaded to the Hall sensor, which receives and uses said information).

For instance, according to one embodiment, it is possible to choose the voltage $V_{OFFSET}$ to be supplied to the terminal 22b of the second operational amplifier 22 of a value such that, in the absence of external magnetic field B, the voltage on the output terminal 22c has a value equal to $V_{force}$. Knowing the voltage value of the signal on the output terminal 22c in the absence of magnetic field B, it is thus possible to choose the voltage value of the signal $V_{OFFSET}$ as the value for which the signal on the output terminal 22c has the ideal value that it would have in the absence of non-idealities (i.e., $V_{OFFSET}$ is chosen of a value such as to bring the output 22c of the second operational amplifier 22 to the value $V_{force}$). The signal $V_{R\_OUT}$ present across the feedback resistor 26 in this operating condition is chosen as zero magnetic field signal, on the basis of which the variations caused by the presence of the external magnetic field B are measured to evaluate the intensity thereof.

In particular, according to one embodiment, the voltage value $V_{OFFSET}$ is a function of the voltage value $V_{O1}$ on the third terminal 6, and is equal to $V_{O1}+V_X$, where $V_X$ is a voltage value chosen for obtaining on the output 22c of the second operational amplifier 22, with zero magnetic field B, the ideal voltage value (e.g., Vdd/2). In any case, $V_{O1}$ is dependent upon the voltage $V_{force}$, and consequently it follows that, considering the non-idealities of the first operational amplifier 20, the voltage $V_{OFFSET}$ is a function of the voltage $V_{force}$.

According to a further embodiment, the non-idealities are compensated by a technique of dynamic offset cancellation, known as "current spinning". The current-spinning technique is, for example from P. J. A. Munter, "A low-offset spinning-current Hall plate", Sensors and Actuators, A21-A23, pp. 743-746, 1990, in a per se known manner (document incorporated by reference).

Figure 3:
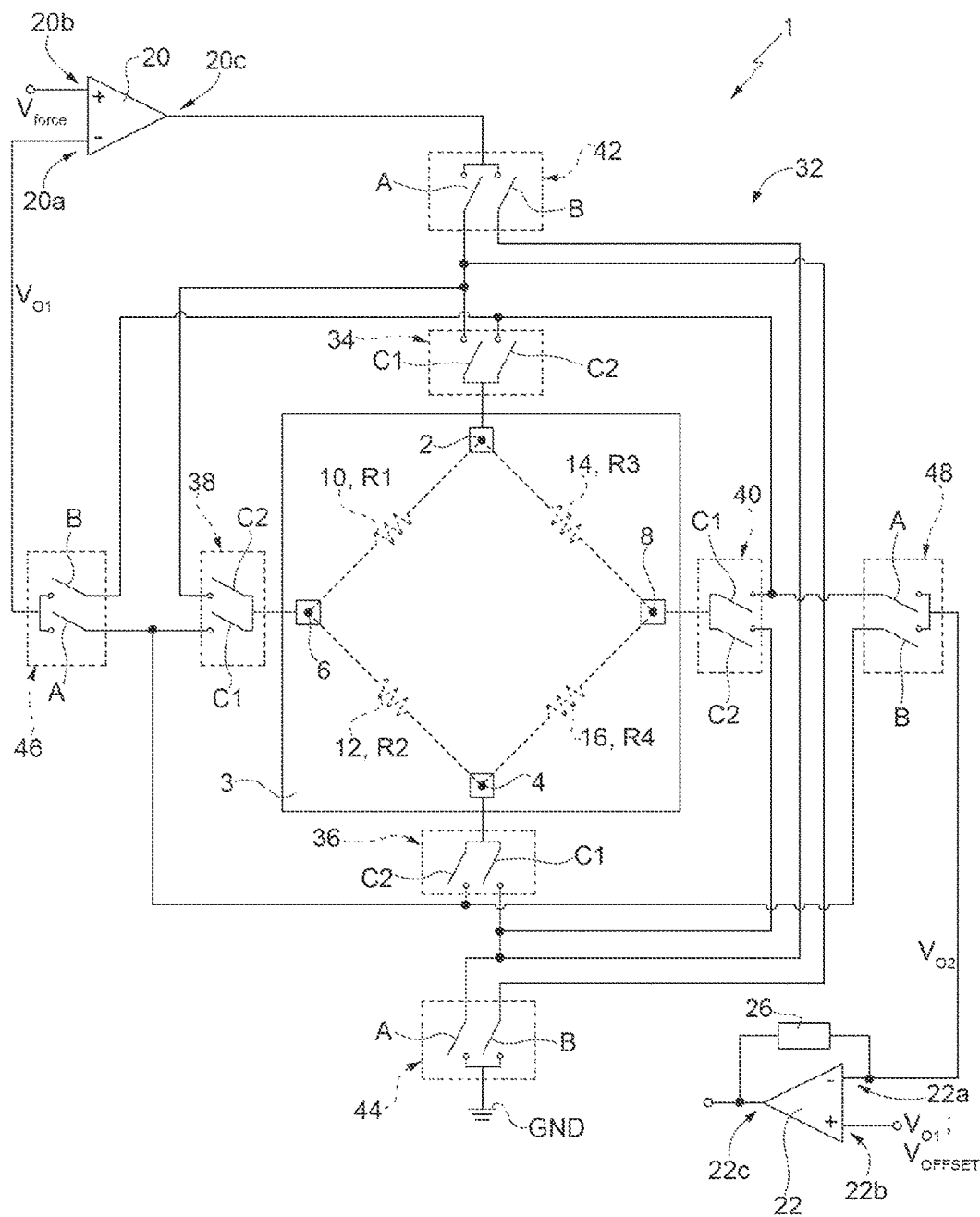
FIG. 3 shows the magnetic field sensor of FIG. 2 including a current-spinning circuit, for compensation of non-idealities.

FIG. 3 shows the magnetic field sensor 1 in a configuration such as to implement the current-spinning technique.

The Hall sensor 1 of FIG. 3 comprises, in addition to the elements already illustrated and described with reference to FIG. 2 (in particular, the Hall cell 3, the first operational amplifier 20, the second operational amplifier 22), and a spinning circuit 32 including a plurality of switches that are designed to implement spinning of the current $i_{BIAS}$ supplied to the terminals of the Hall cell 3.

The spinning circuit 32 comprises four switch modules 34, 36, 38 and 40. The switch module 34 is electrically coupled to the first terminal 2 of the Hall cell 3. The switch module 36 is electrically coupled to the second terminal 4 of the Hall cell 3. The switch module 38 is electrically coupled to the third terminal 6 of the Hall cell 3. The switch module 38 is electrically coupled to the fourth terminal 8 of the Hall cell 3.

The switch modules 34, 36, 38 and 40 are, from an electrical standpoint, the same as one another. In fact, each switch module 34, 36, 38 and 40 includes a respective first switch C1 and a respective second switch C2, which each have a respective conduction terminal electrically coupled to the same terminal 2, 4, 6 and 8 of the Hall cell 3.

During a first operating condition of the spinning circuit 32, the switches C1 of each switch module 34, 36, 38 and 40 are controlled simultaneously in an ON state (i.e., they are closed), whereas the switches C2 of each switch module 34, 36, 38 and 40 are controlled simultaneously in an OFF state (i.e., they are open). During a second operating condition of the spinning circuit 32, the switches C1 of each switch module 34, 36, 38 and 40 are controlled simultaneously in an OFF state (i.e., they are open), whereas the switches C2 of each switch module 34, 36, 38 and 40 are controlled simultaneously in an ON state (i.e., they are closed).

The spinning circuit 32 further comprises additional switch modules 42, 44, 46, and 48, which from a circuit standpoint are the same as one another and each of which includes a respective first switch A and second switch B.

For instance, the switch A of the switch module 42 has the function of coupling/decoupling the current generator 30 to/from the switch C1 of the switch module 34 (and via the latter to/from the first terminal 2). Further, the switch A of the switch module 42 has the function of coupling/decoupling the current generator 30 to/from the switch C2 of the switch module 38 (and via the latter to/from the third terminal 6).

The switch B of the switch module 42 has, instead, the function of coupling/decoupling the current generator 30 to/from the switch C1 of the switch module 36 (and via the latter to/from the second terminal 4). Further, the switch B of the switch module 42 has the function of coupling/ decoupling the current generator 30 to/from the switch C2 of the switch module 40 (and via the latter to/from the fourth terminal 8).

Likewise, the switches A and B of the switch module 44 have the function of coupling/decoupling the ground terminal GND alternatively to/from the first input 2, to/from the second input 4, to/from the first output 6, or to/from the second output 8, via the further control of the respective switches C1 and C2 of the switch modules 34, 36, 38 and 40.

In this way, in use, it is possible to make the supply of the biasing current $i_{BIAS}$ to spin between the terminals 2, 4, 6, 8 of the Wheatstone bridge of the Hall cell 3 for providing four different paths for the biasing current $I_{BIAS}$.

Likewise, the switches A and B of the switch modules 46 and 48 are controlled, in the first and second operating conditions of the spinning circuit 32, for coupling/decoupling the first and second operational amplifiers 20, 22 alternatively to/from all the terminals 2, 4, 6, 8 of the Wheatstone bridge of the Hall cell 3 for acquiring four different output voltages.

By way of example, the first operating condition corresponds to a situation in which all the switches C1 are in the ON state and all the switches C2 are in the OFF state. In this condition, when also all the switches A are on, we have the situation of FIG. 2. The biasing current $I_{BIAS}$ flows from the first terminal 2 (input I1) to the second terminal 4 (input I2). The first operational amplifier 20 has its inverting terminal coupled to the third terminal 6 of the Hall cell (output O1), and the second operational amplifier 22 has its inverting terminal coupled to the fourth terminal 8 of the Hall cell (output O2).

Remaining in the first operating condition, by turning off the switches A and turning on the switches B, a situation is obtained whereby the flow of biasing current $I_{BIAS}$ is reversed; i.e., the biasing current $I_{BIAS}$ flows from the second terminal 4 (which thus provides the input I1) to the first terminal 2 (which thus provides the input I2), coupled to the reference terminal (e.g., GND). The first operational amplifier 20 has, in this case, its inverting terminal coupled to the fourth terminal 8 of the Hall cell 3 (which thus provides the output O1), and the second operational amplifier 22 has its inverting terminal coupled to the third terminal 6 of the Hall cell (which thus provides the output O2).

The second operating condition corresponds to a situation in which all the switches C2 are in the ON state and all the switches C1 are in the OFF state. In this condition, when also all the switches A are on, the biasing current $I_{BIAS}$ flows from the third terminal 6 of the Hall cell 3 to the fourth terminal 8 of the Hall cell 3 (the latter terminal is coupled to ground GND). The first operational amplifier 20 has its inverting terminal coupled to the second terminal 4 of the Hall cell 3, and the second operational amplifier 22 has its inverting terminal coupled to the first terminal 2 of the Hall cell 3.

Remaining in the second operating condition, by turning off the switches A and turning on the switches B, a situation is obtained whereby the flow of biasing current $I_{BIAS}$ is reversed; i.e., the biasing current $I_{BIAS}$ flows from the fourth terminal 8 of the Hall cell 3 to the third terminal 6 of the Hall cell 3 (the third terminal 6 is in fact coupled to ground GND). The first operational amplifier 20 has, in this case, its inverting terminal coupled to the first terminal 2 of the Hall cell 3, and the second operational amplifier 22 has its inverting terminal coupled to the second terminal 4 of the Hall cell 3.

In this way, the biasing current has traversed all the possible paths between the terminals 2, 4, 6, 8 of the Hall cell 3. Likewise, also the voltage supplied to the inverting terminal 22a of the second operational amplifier 22 has been acquired on each terminal 2, 4, 6, 8 of the Hall cell 3, for each current path.

For each of the four current paths described previously the voltage signal $V_{R\_OUT}$ is acquired across the feedback resistor 26. There are thus acquired voltage signals that indicate the magnetic field B that acts upon the Hall cell 3 and that are further affected by an offset generated by the non-idealities of the resistors 10-16 and of the operational amplifiers 20, 22. The appropriate combination (e.g., sum or temporal average) of the four voltage signals $V_{R\_OUT}$ thus acquired enables a result signal that is without offset to be obtained. In fact, by making the current to spin from one contact to another of the Hall sensor according to the current-spinning technique, we have that the signal due to the magnetic field B and the offset alternatively change sign. By adding said signals together a sum is thus obtained of the useful signals and a difference between the offset components, according to the known operation of the circuits used for current spinning.

The magnetic field sensor 1 of FIG. 2 or FIG. 3 may be obtained in an integrated form in a die comprising an appropriately doped semiconductor or insulating substrate. The operational amplifiers 20, 22 may coexist on the same substrate. Alternatively, the amplifiers 20, 22 may be provided on a different substrate and operatively coupled to the Hall cell 3 subsequently.

According to a further aspect of the present invention (FIG. 4), a plurality of Hall cells 3, 3' (here, two Hall cells 3, 3') may be coupled together in parallel. The Hall cell 3' is of the same type as the Hall cell 3.

In this case, a plurality of Hall cells 3, 3' of the type shown in FIG. 2 have their respective first input terminals 2, 2' coupled together to a common node 50, and their respective second input terminals 4, 4' coupled together to a common node 52 (coupled to the reference terminal, for example at ground voltage GND).

The first output 6, 6' of each Hall cell 3, 3' is coupled to the inverting terminal 20a of the first operational amplifier 20, whereas the second output 8 of each Hall cell 3 is coupled to the inverting terminal 22a of the second operational amplifier 22.

In this way, we have the advantage that the signal $V_{R\_OUT}$ across the resistor 26 is a signal that is a function of the magnetic field B to which all the Hall cells 3, 3', are subject and has a value higher than in the case of FIG. 2, where just one Hall cell 3 is present. The current that flows through the feedback resistor 26 is thus the sum of the currents that would be generated in feedback by the second operational amplifier 22 for each Hall cell 3, 3' considered individually. Consequently, the signal $V_{R\_OUT}$ indicates the sum of the feedback currents and is thus an amplified signal.

The non-inverting terminal 20b of the first operational amplifier 20 is biased at the voltage $V_{force}$ (e.g., Vdd/2), whereas the non-inverting terminal 22b of the second operational amplifier 22 may be biased at the voltage $V_{O1}$ present on the first output 6 or else at the reference voltage $V_{OFFSET}$ chosen as described previously.

Figure 4:
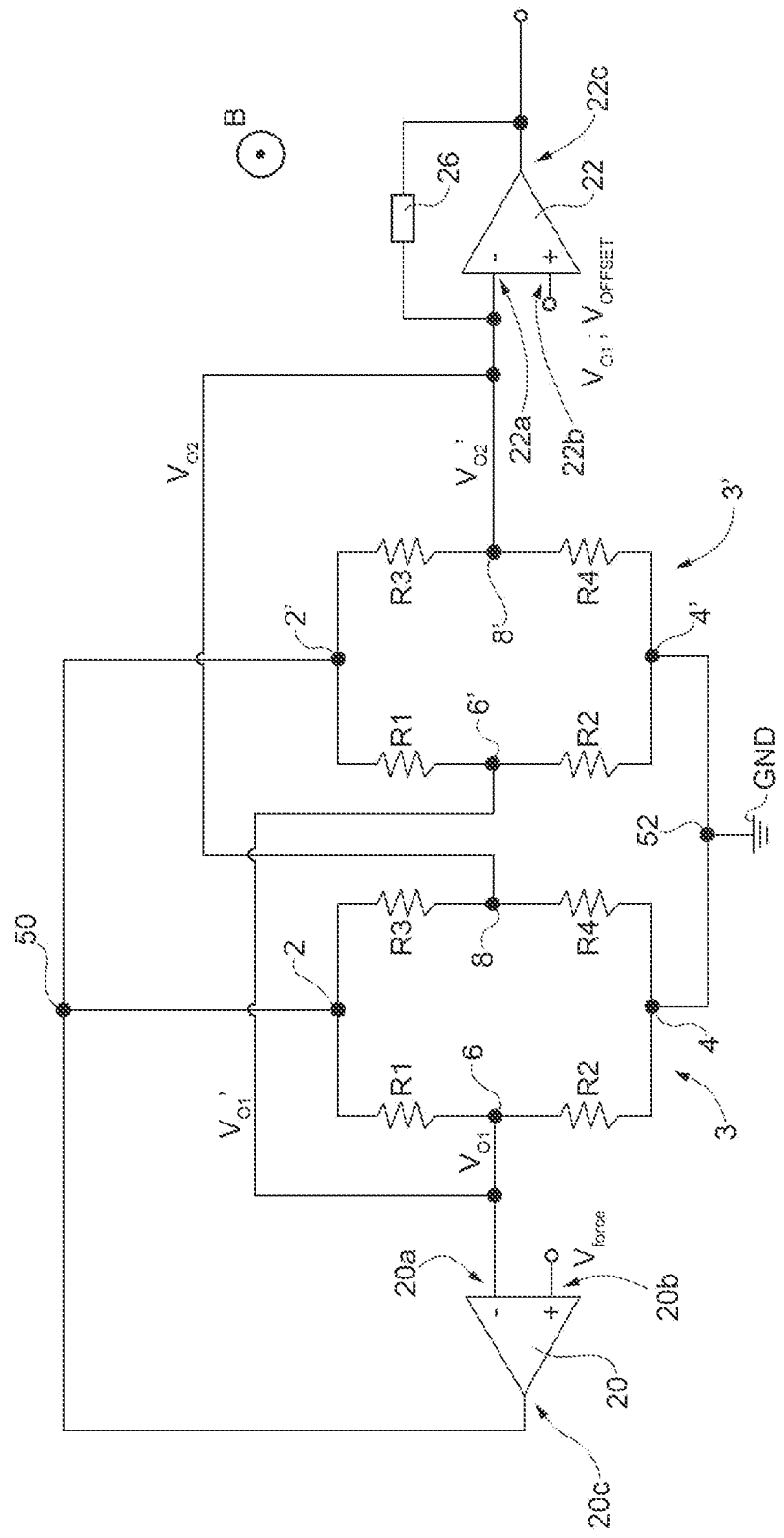
FIG. 4 is a circuit representation of a magnetic field sensor according to a further embodiment.

To compensate the offsets, it is further possible to couple operatively, to each Hall cell 3 of FIG. 4, or to the set of the Hall cells 3 in parallel, a spinning circuit 32 of the type described previously.

The present invention finds, for example, application in a system for accurate measurement of the currents that flow in a conductor, e.g., a wire or a conductive structure provided in integrated electronic circuits, either to detect appropriate electrical quantities, correlated to the current flowing in the integrated electronic circuit, or to monitor operation of the electronic circuit itself correctly. The magnetic field sensor 1 may thus be used for measuring the current flowing in said wire, which, for example, forms a coil, which generates, as is known, a magnetic field correlated to the current in the wire itself. The deviation of the charges in the Hall cell 3, generated by the Hall effect as discussed previously, is detected as potential on the feedback resistor 26 and represents a measurement of the current flowing in the wire.

The advantages according to the present disclosure emerge clearly from the foregoing description.

In particular, the presence of the first operational amplifier 20 fixes the voltage on the terminal 6 of the Wheatstone bridge at the pre-set value $V_{force}$. In this way, even in the presence of a variable magnetic field that acts upon the Hall cell 3, we do not have phenomena of charge and discharge of the parasitic capacitance on the terminal 6. The same reasoning applies as regards the terminal 8. Also here, the presence of the second operational amplifier 22 coupled to the terminal 8 of the Wheatstone bridge has the function of fixing the voltage on the terminal 8 at the value $V_{O1}$ or $V_{OFFSET}$ present on the other input of the second operational amplifier 22. In the presence of the same variable magnetic field acting upon the Hall cell 3, we do not have phenomena of charge and discharge of the parasitic capacitance on the terminal 8. The bandwidth of the entire circuit is considerably improved.

The presence of various alternatives for compensating/reducing the offsets due to the non-idealities of the elements that provide the circuit further guarantees freedom of implementation of the preferred offset-compensation procedure, according to the needs and preferences of the designer or to the system in which the present invention is implemented.

Finally, it is clear that modifications and variations may be made to what has been described and illustrated herein, without thereby departing from the scope of the present invention, as defined in the annexed claims.

For instance, it is possible to couple an analog-to-digital converter (not shown) across the feedback resistor 26, for acquiring the (analog) voltage signal generated following upon the flow of feedback current through the resistor 26 and generating a digital signal.

The invention claimed is:

1. A circuit, comprising:
a Hall effect cell having first, second, third and fourth nodes;
a first circuit having a first input coupled to the third node, a second input coupled to receive a non-zero force voltage and an output coupled to the first node, said first circuit configured to bias the first node at a first voltage and further provide a bias current flowing through the Hall effect cell from the first node to the second node; and
a second circuit having a first input coupled to the fourth node, a second input coupled to receive a non-zero offset voltage different from said non-zero force voltage and an output coupled by a feedback resistor to the fourth node to maintain the fourth node at the non-zero offset voltage and generate an output voltage across terminals of said feedback resistor having a magnitude corresponding to an intensity of a magnetic field acting on the Hall effect cell and a sign corresponding to a direction of said magnetic field.

2. The circuit of claim 1, wherein the first circuit comprises a differential amplifier circuit having an inverting input coupled to the third node, a non-inverting input coupled to receive the non-zero force voltage and an output coupled to the first node.

3. The circuit of claim 1, wherein the second circuit comprises a differential amplifier circuit having an inverting input coupled to the fourth node and a non-inverting input coupled to receive the non-zero offset voltage, said feedback resistor coupled between an output of the differential amplifier and the inverting input.

4. The circuit of claim 1, further comprising a current spinning circuit configured to spin application of the bias current to the first through fourth nodes and further configured to spin coupling of the first inputs of the first and second circuits to the first through fourth nodes.

5. A magnetic field sensor circuit, comprising:
a first Hall cell having a first, second, third and fourth conduction nodes wherein, in an operating condition relating to presence of a magnetic field acting upon the first Hall cell, a Hall voltage is generated between said third and fourth conduction nodes;
a first biasing circuit operatively coupled between said first and third conduction nodes and configured to bias the first conduction node at a first operating voltage and generate a flow of a control current between the first and second conduction nodes to drive the third conduction node to a non-zero force voltage;
a second biasing circuit having a first input terminal operatively coupled to the fourth conduction node, a second input terminal adapted to receive a non-zero offset voltage that is different from the non-zero force voltage and an output terminal coupled in a feedback mode to the first input by a feedback resistor;
wherein the second biasing circuit is configured to generate, in the presence of the magnetic field, a feedback current through the feedback resistor to maintain the fourth conduction node at the non-zero offset voltage; and
wherein an output voltage across the feedback resistor in response to said feedback current indicates an intensity and direction of said magnetic field.

6. The magnetic field sensor according to claim 5, wherein said first biasing circuit includes a first operational amplifier having a first input terminal electrically coupled to said third conduction node, a second input terminal biased at the non-zero force voltage and an output terminal coupled to the first conduction node.

7. The magnetic field sensor according to claim 6, wherein the second biasing circuit includes a second operational amplifier having said first input terminal coupled as an inverting input, said second input terminal coupled as a non-inverting input to receive the non-zero offset voltage, and said output terminal coupled as an output terminal.

8. The magnetic field sensor according to claim 5, further comprising a current-spinning circuit coupled to the first Hall cell.

9. The magnetic field sensor according to claim 5, wherein said non-zero offset voltage differs from the non-zero-force voltage by a value such that, in the absence of magnetic field, said output voltage signal has a value equal to said non-zero force voltage.

10. The magnetic field sensor according to claim 5, further comprising a second Hall cell having first, second, third and fourth conduction nodes, wherein the first conduction nodes of the first and second Hall cells are directly connected to each other, the third conduction nodes of the first and second Hall cells are directly connected to each other and the fourth conduction nodes of the first and second Hall cells are directly connected to each other.

* * * * *

UNITED STATES PATENT AND TRADEMARK OFFICE
CERTIFICATE OF CORRECTION

PATENT NO. : 9,664,753 B2  
APPLICATION NO. : 14/637698  
DATED : May 30, 2017  
INVENTOR(S) : Giulio Ricotti et al.

Page 1 of 1

It is certified that error appears in the above-identified patent and that said Letters Patent is hereby corrected as shown below:

In the Specification

At Column 5, Line number 34, please replace the term [[$V_u$,]] with the term -- $V_n$, --

Signed and Sealed this  
Eighteenth Day of July, 2017

Joseph Matal  
*Performing the Functions and Duties of the*  
*Under Secretary of Commerce for Intellectual Property and*  
*Director of the United States Patent and Trademark Office*